United States Patent [19]

Stambaugh

[11] Patent Number: 4,715,052
[45] Date of Patent: Dec. 22, 1987

[54] FREQUENCY DIVIDE BY N CIRCUIT

[75] Inventor: Mark A. Stambaugh, Missouri City, Tex.

[73] Assignee: Texas Instruments Incorporated, Dallas, Tex.

[21] Appl. No.: 838,066

[22] Filed: Mar. 10, 1986

[51] Int. Cl.$^4$ .................... H03K 21/10; H03K 23/44; H03K 23/48

[52] U.S. Cl. .................... 377/108; 377/72; 377/74; 377/105; 377/47

[58] Field of Search .................... 377/105, 47, 48, 54, 377/18, 75, 76, 108, 72, 74; 307/219.1

[56] References Cited

U.S. PATENT DOCUMENTS

| | | | |
|---|---|---|---|
| 3,258,696 | 6/1966 | Heymann | 377/75 |
| 3,609,391 | 9/1971 | Hatano et al. | 377/75 |
| 3,898,480 | 8/1975 | Spence et al. | 377/75 |
| 3,930,169 | 12/1975 | Kuhn, Jr. | 377/105 |
| 4,002,926 | 1/1977 | Moyer | 377/47 |
| 4,353,030 | 10/1982 | Nakamura et al. | 377/47 |

Primary Examiner—John S. Heyman
Attorney, Agent, or Firm—John G. Graham; Rodney M. Anderson

[57] ABSTRACT

A frequency divide by n circuit, where n is an odd number, which includes means for splitting an incoming clock signal of frequency "f" into two non-overlapping complementary clock signals of frequency "f" and a shift register circuit. The shift register circuit is coupled to the signal splitting means and generates an output clock signal of frequency f/n in response to the two complementary clock signals. The output clock signal has a duty cycle equal to $((n-1)/2+D_{in})/n$ where $D_{in}$ is the duty cycle of the incoming clock signal. The output duty cycle is substantially independent of processing and operating conditions.

14 Claims, 4 Drawing Figures

FREQUENCY DIVIDE BY N CIRCUIT

BACKGROUND

The present invention relates to a divide by n circuit, where n is an interger, for use in generating a second clock signal of frequency f/n from a first clock signal of frequency f.

In response to pressure for incorporating more and more circuitry onto a circuit board there has developed pressure to save board space by reducing the number of separate packages wherever possible. A reduction in the number of separate packages makes it attractive to place as much circuitry as possible onto a given semiconductor chip or within a given package. One way of meeting this challenge is to reduce the number of separate oscillators required and to generate one or more clock signals from a single oscillator circuit. Division of a master oscillator clock frequency by a factor of 2,4,8 etc. is relatively straight forward through the use of standard divide by 2 circuits and produces an output duty cycle of about 50%. However, if a division by an odd factor is required, then generally a poor duty cycle results. Typically, for example, a divide by 3 circuit is made by simple logic that pulls the output high (or low) for one cycle and then low (or high) for 2 cycles producing an output clock with only a 33% duty cycle. Other methods for achieving a higher duty cycle exist using phase lock loops or other linear feedback circuits that obtain acceptable results with linear processing but not with digital processing.

Accordingly, an object of the present inventions is to provide an improved divide by n circuit where n is an odd whole number.

SUMMARY OF THE INVENTION

According to the invention there is provided a frequency divide by n circuit, where n is an odd number, which includes means for splitting an incoming clock signal of frequency "f" into two non-overlapping complementary clock signals of frequency "f" and a shift register circuit. The shift register circuit is coupled to the signal splitting means and generates an output clock signal of frequency f/n in response to the two complementary clock signals. The output clock signal has a duty cycle equal to $((n-1)/2 + D_{in})/3$ where $D_{in}$ is the duty cycle of the incoming clock signal.

BRIEF DESCRIPTION OF THE DRAWINGS

The novel features believed characteristic of the invention are set forth in the appended claims. The invention itself, hwoever, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 4:
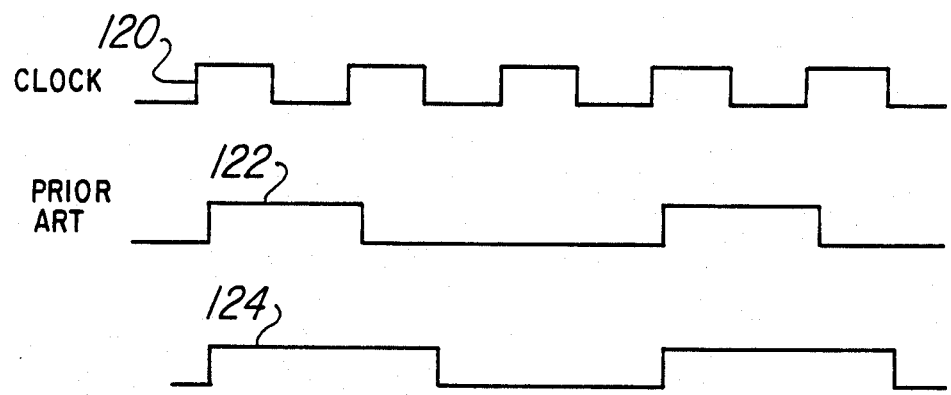
FIG. 4 is a waveform diagram showing a clock, the output from a prior art divide by 3 circuit and the output of a divide by 3 circuit in accordance with the present invention.

Referring to FIG. 4, there is shown a clock waveform 120 from which other clock waveforms are obtained. The second waveform 122 is the result of a divide by 3 circuit operating on signal 120 in which a simple logic circuit pulls the output high (or low) for one cycle and then low (or high) for 2 cycles. The duty cycle of the signal 122 is only 33⅓% which allows less time in the positive half cycle to carry out selected functions for a given frequency than would a duty cycle of 50%.

Figure 1:
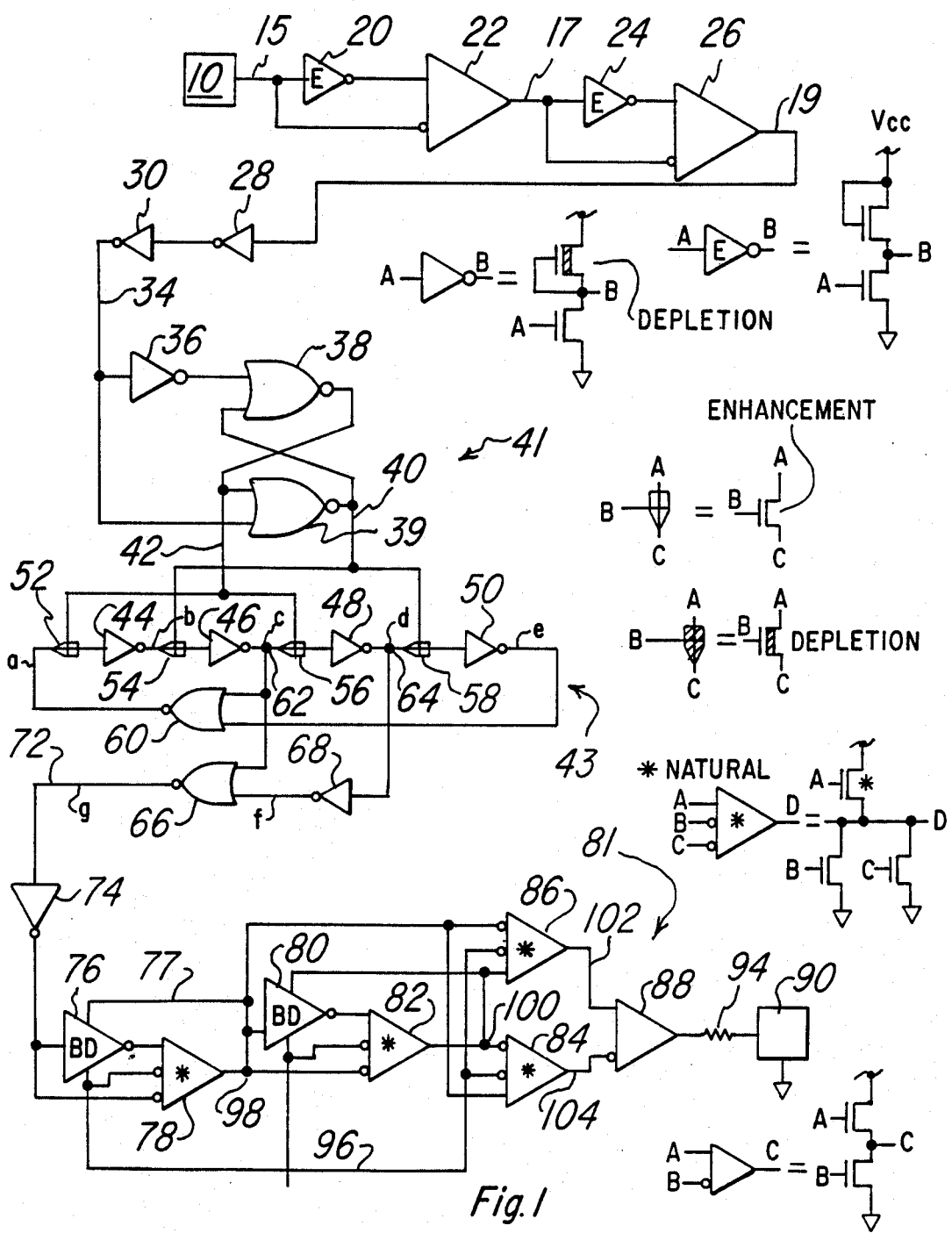
FIG. 1 is a circuit diagram of a divide by 3 circuit in accordance with the invention together with a number of symbol equivalence diagrams.

Referring to FIG. 1, a clock 10 is coupled by a line 15 to the input of an enhancement inverter 20 of an input buffer circuit 21. An output of inverter 20 is connected to a non-inverting input of a driver 22 while line 15 connects to an inverting input of driver 22. A similar conbination of inverter 24 and driver 26 follows the inverter 20 and driver 22 combination. An output 19 of driver 26 passes through series-connected inverters 28 and 30. An output 34 of inverter 30 connects to NOR circuit 39 and through inverter 36 to NOR circuit 38 of flip flop circuit 41. An output of NOR circuit 38 is connected to an input of NOR circuit 39 and similarly, an output of NOR circuit 39 is connected to an input of NOR circuit 38.

Figure 2:
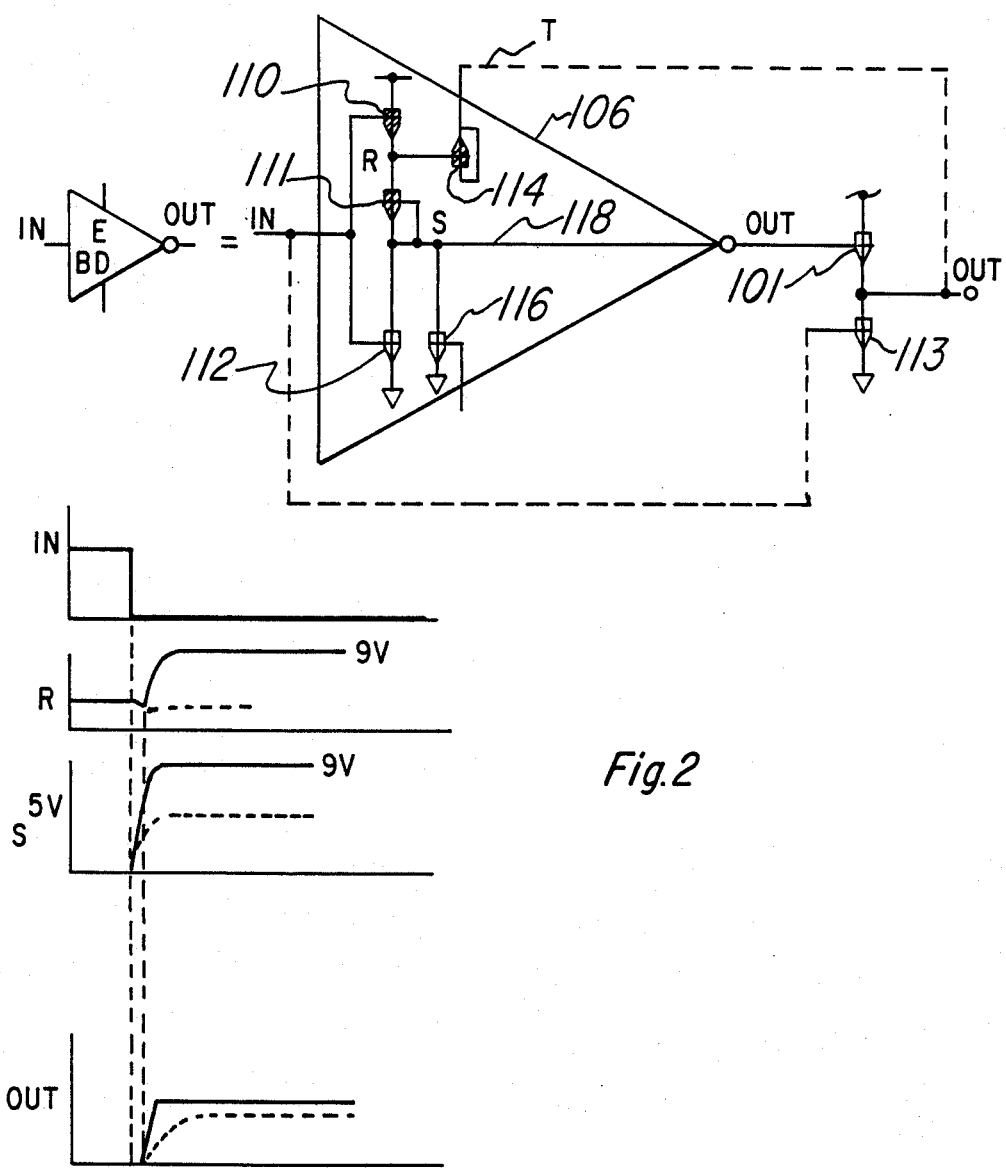
FIG. 2 is a more detailed view of a bootstrapping driver used in the circuit of FIG. 1.

Line 40 couples the output of NOR circuit 39 to gates of pass transistors 54 and 58 while line 42 connects the output of NOR circuit 38 to gates of transistors 52 and 56. A digital feedback dual shift register circuit 43 is in the form of a loop which includes inverters 44,46,48 and 50, NOR circuit 60 and pass transistors 52,54,56 and 58. NOR circuit 66 has one input coupled to node 62 and another coupled through inverter 68 to node 64. An output of NOR circuit 66 is applied by line 72 to an output buffer circuit 81 having an input inverter 74. The output buffer circuit 81 has a pair of tri-state bootstrap drivers 76 and 80, enhancement/natural drivers 78,82,84 and 86 having inverting and non-inverting inputs and an enhancement output driver 88 also with inverting 104 and non-inverting 102 inputs. An output of driver 88 is directed through a small series resistor 94 to an output terminal 90 coupled to ground. Adjacent the circuit shown in FIG. 1 are a number of legends showing the standard symbol used for each non-standard Details of the bootstrapping drivers 76 and 80 are shown in FIG. 2 and consist of an input IN coupled in parallel to gates of a depletion precharge transistor 110 and an enhancement pull-down transistor 112. A tri-state transistor 116 when turned on, grounds output 118.

Transistor 114 is a bootstrapping transistor used as a capacitor that provides positive feedback in circuit 81 that helps the output 118 rise more rapidly approaching a linear ramp increase rather than a conventional RC increase. The waveforms in FIG. 2 shows the response at various locations of the circuit to a step input when connected as shown by the dotted lines to a pair of transistors 101 and 113. The effect of the feedback capacitor formed by transistor 114 is to increase the voltage on node R and hence on node S above what it would otherwise be and, as a result, to increase the rise time of the output voltage increase.

Figure 3:
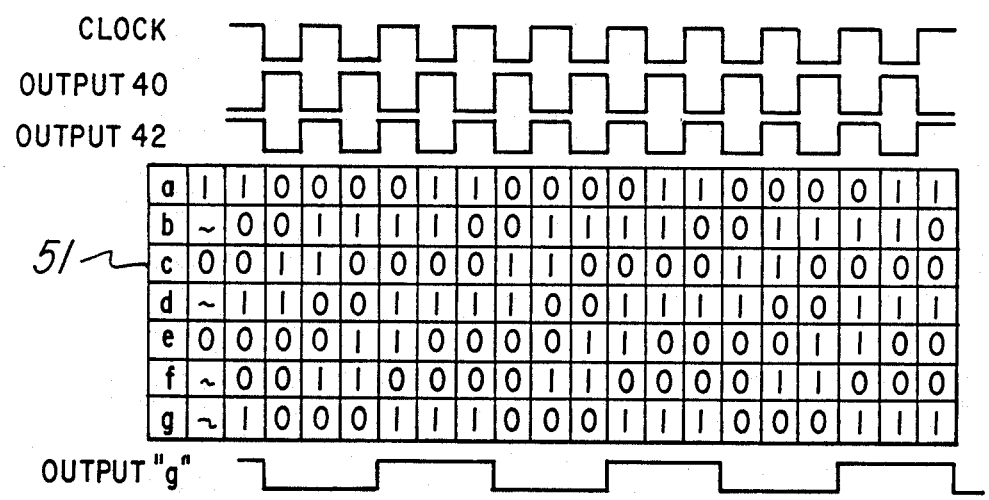
FIG. 3 is a diagram of the waveforms of the clock, of the flip flop output, of the output of the shift register circuit and a table of signal levels shifted through the shift register.

In operation a clock 10 which generated a clock signal, as shown in FIG. 3, on line 15 travels through a pair of drivers 22 and 26 and then through a pair of series coupled inverters 28 and 30 before travelling on line 34 to flip flop circuit 41. The waveform on line 34 (and therefore the duty cycle of the signal) will be the same as that of the input clock except for some phase shift. Logic block 41 generates two out of phase nonoverlapping signals of the same wavelength as that on line 34 except that that of output 40 will be the inverse of that on line 34. The signals on lines 40 and 42 are used to gate sets of transistors 54 and 58 and 52 and 56, respectively. Positive going half cycles on line 40 trigger on pass transistors 54 and 58 thereby transferring signal levels on nodes b and d through inverters 46 and 50 to nodes c and e, respectively. Positive going half cycles on line 42 trigger on pass transistors 52 and 56 which transfer signal levels on nodes a and c through inverters 44 and 48 to b and d, respectively, and through inverter 68 to node f. The logic introduced by NOR circuit 60 whose inputs are coupled to node c and through inverter 50 to node d produce outputs on node a which result in alternate sets of two 1's and four 0's. NOR circuit 66 whose inputs are coupled to node c and node f produce alternate sets of three 0's and three 1's resulting in waveform g which has a frequency of ⅓ that of the clock 10 and a 50% duty cycle. The duty cycle is determined from the formula $(1+D_{in})/3$ where $D_{in}$ is the duty cycle of the incoming signal on line 15. A table of states at nodes a, b, c, d, e, f, and g on the shift register circuit 42 is shown in FIG. 3. On powering up the circuit the states for each node may be "0" or "1" but within 1 or 2 half cycles the states will cycle through a set patterns no matter what the power-up states happen to be.

Buffer circuit 81 boosts the driving power of the signal on line 72 as well as inverting it. From the output of inverter 74 the signal enters inverting driver 76 and an inverting input of driver 78. The output of driver 76 enters a non-inverting input of driver 78. Thus, in travelling to node 98 the signal passing through driver 78 goes through 1 inversion as does the signal going into the inverting input of driver 78. Positive feedback along line 77 improves the linearity of the rise time of the output signal from driver 76. From node 98 the signal does through a substantially identical set of drivers 80 and 82 to a node 100. The signal from node 98 also travels to an inverting input of driver 86 and a non-inverting input of driver 84. Node 100 couples to a non-inverting input of driver 86 and inverting input of driver 84. The output of enhancement driver 88 passes through a small damping resistor 94 before arriving at an output terminal 90.

An important feature of the circuit of FIG. 1 is that in each of the input buffer 21, flip flop 41 together with shift register 43, and output buffer circuit 81 a positive going transition undergoes the same number of inversions as does a negative going transition. For example, in travelling through inverters 28 and 30, the rise time at the output of inverter 28 will be the same as that at the output of inverter 30 while the fall time at the output of inverter 28 will be the same as that at the output of inverter 30. Since each transition will undergo one positive transition and one negative transition whether it is a positive or negative going at the input of inverter 28 there will be equal delays for positive and negative going input transitions in travelling through the two inverters 28 and 30.

In travelling from line 34 through the flip flop circuit 41 and shift register 43, a positive transition undergoes two inversions in going through inverter 36 and NOR gate 38 or in going through NOR gates 39 and 38. There are three further inversions triggered by the signal on line 42 in going through inverters 48 and 68 and NOR gate 66 for a total of 5 inversions. A negative going transition on line 34 going through inverter 36, NOR gate 38 and NOR gate 39 undergoes 3 transistions and in gating on pass gate 54 triggers two further inversions through inverter 46 and NOR gate 66 for a total of 5 inversions. A similar equality in the number of inversions holds true for any other segment of the circuit of FIG. 1.

Another important feature of the circuit of FIG. 1 resides in a balanced layout of the circuitry. As explained previously, each inversion is matched by another inversion to result in equal delays for a signal going high versus signals going low. In addition to the logic design required to implement this, the circuit layout must ensure that the ratio of device sizes to parasitic loading of each inverter of a matched pair of inverters be the same so that the rise times of each inverter are substantially the same as are the fall times to achieve a 50% output duty cycle. With such a balanced layout, any variation in the operating conditions will cause equal delays in high to low versus low to high transitions.

Obviously while a divide by 3 circuit has been described the invention is applicable to divide by 5, by 7, etc. circuits as well by simply expanding the shift register loop 43. For a divide by n circuit the duty cycle is given by the following formula:

Duty Cycle = $((n-1)/2 + D_{in})/n$

The duty cycle as computed by the foregoing formula is largely independent of processing and operating conditions. The invention is particularly useful for odd n.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications as fall within the true scope of the invention.

What is claimed is:

1. A frequency divide by n circuit, where n is an odd integer, comprising:

means for splitting an incoming clock signal of frequency "f" into a first and a second clock signal, said first and second clock signals being nonoverlapping and complementary relative to one another, and having a frequency "f";

a shift register circuit comprising:

a first stage, having a pass gate therein which is controlled by said first complementary clock signal;

a second stage, having a pass gate therein which is controlled by said second complementary clock signal;

a plurality of intermediate stages, each of said intermediate stages having a pass gate therein which is controlled by one of said complementary clock signals, said intermediate stages connected in a series with said first and second stages with first and second complementary clock signals controlling pass gates in alternating stages; and feedback logic having a first input connected to said second stage, having a second input connected to an intermediate stage in said series, and having an output connected to said first inverting stage, for providing a feedback signal to said first inverting stage, said feedback signal having a frequency of f/n; and output logic, having a first input connected to one of said intermediate stages, and having a second input connected to an adjacent one of said intermediate stages, so that the output signal of said output logic has a frequency of f/n and a duty cycle corresponding to that of said incoming clock signal.

2. A circuit according to claim 1, further comprising:
an input buffer circuit for receiving said incoming clock signal, said input buffer circuit having an output connected to said splitting means; and
an output buffer circuit having an input coupled to the output of said output logic.

3. A circuit according to claim 2, wherein said splitting means is a flip flop circuit.

4. A circuit according to claim 3, wherein said input buffer, flip flot, shift register and output buffer circuits are such that positive going transitions travelling through said circuits undergo the same number of inversions as do negative going transitions.

5. A circuit according to claim 4, wherein n is 3.

6. A circuit according to claim 5, wherein said shift register circuit includes two of said intermediate stages;
wherein each of said stages in said shift register circuit has its pass gate connected at its input;
wherein said feedback logic comprises a NOR circuit having one input coupled to an output of the first of said intermediate stages in said shift register circuit, another input coupled to an output of said second stage in said shift register circuit, and an output coupled to the pass gate at the input to said first stage.

7. A circuit according to claim 6, wherein said output logic circuit is an output NOR circuit having one input coupled to an output of said first of said intermediate stages and another input coupled to an output of said second intermediate stage.

8. A circuit according to claim 1, wherein said frequency divide by n circuit has a plurality of matched inverters such that for each inverter there is another inverter for which the ratio of the device size to the parasitic capacitance is such that both inverters has substantially the same rise time and the same fall times.

9. A circuit according to claim 8, wherein n is 3.

10. A frequency divide by 3 circuit, comprising:
an input driver circuit couplable to an input clock signal of frequency "f";
means for splitting said clock signal into a pair of complementary non-overlapping clock signals of frequency "f";

a shift register circuit coupled to said splitting means for generating an output clock signal of frequency f/3 in response to said two complentary clock signals comprising:

a series of four inverting stages, each inverting stage having an inverter and a pass gate therein, said pass gates in the first and third of said inverting stages controlled by a first one of said complementary clock signals, said pass gates in the second and fourth of said inverting stages controlled by a second one of said complementary clock signals;

feedback logic having a first input connected to said second inverting stage and second input connected to said fourth inverting stage, and having an output connected to said first inverting stage for providing to said first inverting stage a feedback signal of frequency f/3; and output logic having a first input connected to said second inverting stage and a second input connected to said third inverting stage, for presenting at its output a signal having a frequency of f/3 and a duty cycle corresponding to the duty cycle of said input clock signal; and an output buffer coupled to the output of said output logic of said shift register circuit.

11. A circuit according to claim 10, wherein said input driver, shift register and output buffer are such that a high to low signal transition travelling along a path in said circuits undergoes an equal number of inversions as would a low to high signal transition in travelling along the same path.

12. A circuit according to claim 10, wherein said splitting means is a flip flop circuit.

13. A circuit according to claim 11, wherein said inverting stages each have their pass gate at an input to each inverter;
wherein said feedback logic comprises a NOR circuit having one input coupled to an output of said second inverting stage, another input coupled to an output of said fourth inverting stage and an output coupled to the pass gate at the input of said first inverting stage;
and wherein said output logic comprises a NOR circuit having one input coupled to an output of said second inverting stage and another input coupled through an inverter to an output of said third inverting stage.

14. A circuit according to claim 10, wherein the layout of said divide by 3 circuit includes a plurality of matched inverter pairs such that for each inverter there is another inverter for.which the ratio of device size to parasitic loading is such that both inverters have substantially the same rise time and the same fall times.

* * * * *